US005134624A

United States Patent [19]

Ono

[11] Patent Number: 5,134,624

[45] Date of Patent: Jul. 28, 1992

[54] METHOD AND APPARATUS FOR STABILIZING OSCILLATION FREQUENCY SEPARATION AMONG A PLURALITY OF LASER DEVICES

[75] Inventor: Takashi Ono, Tokyo, Japan

[73] Assignee: NEC Corporation, Tokyo, Japan

[21] Appl. No.: 628,874

[22] Filed: Dec. 18, 1990

[30] Foreign Application Priority Data

Dec. 18, 1989 [JP] Japan ................................ 1-328823

[51] Int. Cl.[5] ................................................ H01S 3/13

[52] U.S. Cl. ........................................ 372/32; 372/28; 372/24; 372/23; 372/33; 359/180

[58] Field of Search ...................... 372/32, 28, 23, 33, 372/24; 370/3; 455/618

[56] References Cited

U.S. PATENT DOCUMENTS

| | | | |
|---|---|---|---|
| 4,835,782 | 5/1989 | Kaede et al. | 372/32 |
| 4,955,026 | 9/1990 | Hill et al. | 372/18 |
| 4,977,565 | 12/1990 | Shimosaka | 372/32 |
| 4,989,201 | 1/1991 | Glance | 370/3 |

*Primary Examiner*—Georgia Y. Epps

*Attorney, Agent, or Firm*—Sughrue, Mion, Zinn Macpeak & Seas

[57] ABSTRACT

A method for stabilizing an oscillation frequency separation among a plurality of laser devices wherein a plurality of laser devices are controlled to emit light outputs each having a predetermined frequency so that a frequency separation is stabilized, wherein the plurality of laser devices are divided into a plurality of groups, in each of which the frequency separation is stabilized in accordance with a reference light output of one reference laser device. On the other hand, a plurality of the reference laser devices are controlled to stabilize a frequency separation each other, so that relative frequency separation among the plurality of groups of the plurality of laser devices are stabilized. As a result, a frequency separation of a large number of laser devices is stabilized.

16 Claims, 10 Drawing Sheets

TERMINAL 404
404a
404a
404a
102a
TIME

TERMINAL 409
409a
409a
102a
TIME

TERMINAL 1 OF COUNTERS 501 AND 502
501a
502a
TIME

TERMINAL 2 OF COUNTERS 501 AND 502
501b
502b
TIME

TERMINAL 3 OF COUNTERS 501 AND 502
502c
501c
TIME

EXOR 503
503a
503b
TIME

EXOR 504
504a
504b
TIME

EXOR 505
505a
TIME

OSCILLATION FREQUENCY CHANGE OF DBR-LD 101A

CHARACTERISTIC OF OPTICAL RESONANCE FREQUENCY OF OPTICAL RESONATOR 126

OUTPUT CHARACTERISTIC OF LOW-PASS FILTER 129A

METHOD AND APPARATUS FOR STABILIZING OSCILLATION FREQUENCY SEPARATION AMONG A PLURALITY OF LASER DEVICES

FIELD OF THE INVENTION

This invention relates to a method and an apparatus for stabilizing oscillation frequency separation among a plurality of laser devices, and more particularly to, a method and an apparatus for stabilizing oscillation frequency separation among a plurality of laser devices applied to optical communication in which light signals are transmitted in optical frequency division multiplexing with a high density of frequencies to increase transmission capacity.

BACKGROUND OF THE INVENTION

A conventional method for stabilizing oscillation frequency separation among a plurality of laser devices has been described in U.S. Pat. No. 4,835,782 issued on May 30, 1989.

In the method for stabilizing an oscillation frequency separation among a plurality of laser devices, a plurality of laser devices are controlled to emit output lights each having a predetermined frequency, so that frequency separation is stabilized. Reference pulses are produced in an optical resonator which has periodic resonant frequencies and receives a frequency swept signal, and beat signals are produced in accordance with the combination of the frequency swept signal and oscillation frequencies of the plurality of laser devices. The reference signals and beat signals thus produced are processed to produce error signals which are time differences between the producing times of the both signals. The plurality of laser devices are controlled to be driven, such that the error signals become a predetermined value.

According to the conventional method for stabilizing oscillation frequency separation among a plurality of laser devices, however, there is a disadvantage in that the number of laser devices which are simultaneously controlled in the oscillation frequency separation is limited to approximately 10, because the number depends on a sweeping range of the frequency of the reference laser device.

SUMMARY OF THE INVENTION

Accordingly, it is an object of the invention to provide a method and an apparatus for stabilizing oscillation frequency separation among a plurality of laser devices in which the number of laser devices which are simultaneously controlled in the oscillation frequency separation is significantly increased not to be limited by a sweeping range of frequency of a reference laser device.

According to a first feature of the invention, a method for stabilizing oscillation frequency separation among a plurality of laser devices, comprises:

sweeping oscillation frequencies of a plurality of reference laser devices in accordance with a corresponding signal of external signals supplied by a plurality of external signal generators to emit different frequency swept light outputs;

dividing each of the frequency swept light outputs emitted from each of the plurality of reference laser devices into first, second and third frequency swept light outputs, respectively;

combining the first frequency swept light outputs of the plurality of reference laser devices to produce a combined frequency swept light output;

passing the combined frequency swept light output through a first optical resonator having periodic resonant frequencies to produce a first reference light output at the periodic resonant frequencies, an interval between the periodic resonant frequencies of the first optical resonator being equal to a predetermined oscillation frequency separation among the plurality of reference laser devices;

converting the first reference light output into a first train of reference electric pulses;

dividing the first train of reference electric pulses into a plurality of first trains of reference electric pulses, a divided number being a number of the plurality of reference laser devices;

detecting each of the plurality of first trains of reference electric pulses synchronously to a corresponding external signal supplied from a corresponding signal generator of the plurality of external signal generators to produce synchronized electric signals;

filtering each of the synchronized electric signals to obtain a low frequency component of each of the synchronized electric signals as a reference error signal;

supplying each reference error signal to a corresponding laser device of the plurality of reference laser devices to control the oscillation frequencies of each of the plurality of reference laser devices such that an averaged center frequency of each of the plurality of reference laser devices is stabilized at one of transmission peaks of the first optical resonator;

driving a plural groups of laser devices each group including a plurality of transmitting laser devices to emit light outputs having oscillation frequencies in a frequency swept range of a light output from a corresponding reference laser device of the plurality of reference laser devices;

passing each of the second frequency swept light outputs emitted from the plurality of reference laser devices through a corresponding optical resonator of a plurality of second optical resonators each having periodic resonant frequencies to produce second reference light outputs at the periodic resonant frequencies, an interval between the periodic resonant frequencies of each of the second optical resonators being equal to a predetermined oscillation frequency separation among the plurality of transmitting laser devices in each group;

converting each of the second reference light outputs into a second train of reference electric pulses;

combining each of the third frequency swept light outputs and light outputs from the plurality of transmitting laser devices in each group to produce combined light signals;

converting the combined light signals into combined electric signals;

filtering the combined electric signals to produce a train of beat pulses corresponding to the oscillation frequencies of the plurality of laser devices;

comparing occurrence times of each of the train of beat pulses and those of the corresponding train of the second trains of reference electric pulses to produce an error signal corresponding to a time difference therebetween; and controlling oscillation frequencies of the plurality of transmitting laser devices in each group such that the error signal is approximately equal to a predetermined value in respective group of the plurality of laser devices.

According to a second feature of the invention, an apparatus for stabilizing oscillation frequency separation among a plurality of laser devices, comprises:

a plurality of oscillation frequency separation stabilizing units, each comprising a signal generator for generating an external signal of an oscillation frequency swept signal, a reference laser device to which the oscillation frequency swept signal is supplied, a plurality of transmitting laser devices each emitting a light output at an oscillation frequency range of a corresponding reference laser device of the plurality of reference laser devices, a unit optical divider for dividing a light output of the reference laser device into at least three light outputs, a first unit optical coupler for combining light outputs from the plurality of transmitting laser devices, a second unit optical coupler from combining one of the three light outputs and a light output combined in the first unit optical coupler, a unit optical resonator through which the other one of the three light outputs is passed to produce reference light outputs corresponding to resonant frequency peaks, first means for converting the reference light outputs to reference electric pulses, second means for converting a combined light output obtained in the second optical coupler to an electric signal, a unit low-pass filter through which a low frequency component of the electric signal is passed to produce beat pulses corresponding to the oscillation frequencies of the plurality of transmitting laser devices, means for producing error signals in accordance with a difference of occurrence times between the reference pulses and the beat pulses, and means for controlling the plurality of transmitting laser devices to be driven in accordance with the error signals, such that said error signals becomes a predetermined value;

an optical coupler for combining remaining light outputs of the at least three light outputs of the plurality of oscillation frequency separation stabilizing units to produce a combined frequency swept light output;

an optical resonator having periodic resonant frequencies through which the combined frequency swept light output is passes to produce a reference light output at the periodic resonant frequencies, an interval between the periodic resonant frequencies of the optical resonator being equal to a predetermined oscillation frequency separation among the plurality of reference laser devices;

means for converting the reference light output into a train of reference electric pulses;

a plurality of means for detecting a corresponding light signal of a plurality of first frequency swept light signals which are divided from the train of reference electric pulses synchronously to the external signal supplied from a corresponding signal generator of the plurality of external signal generators to produce a synchronized electric signal; and a plurality of low-pass filters each passing a corresponding synchronized electric signal to obtain a low frequency component of each of the synchronized electric signals, a number of the low-pass filter being a number of the oscillation frequency separation stabilizing units.

BRIEF DESCRIPTION OF THE DRAWINGS

The invention will be described in more detail in conjunction with appended drawings, wherein.

DESCRIPTION OF THE PREFERRED EMBODIMENTS

Figure 1:
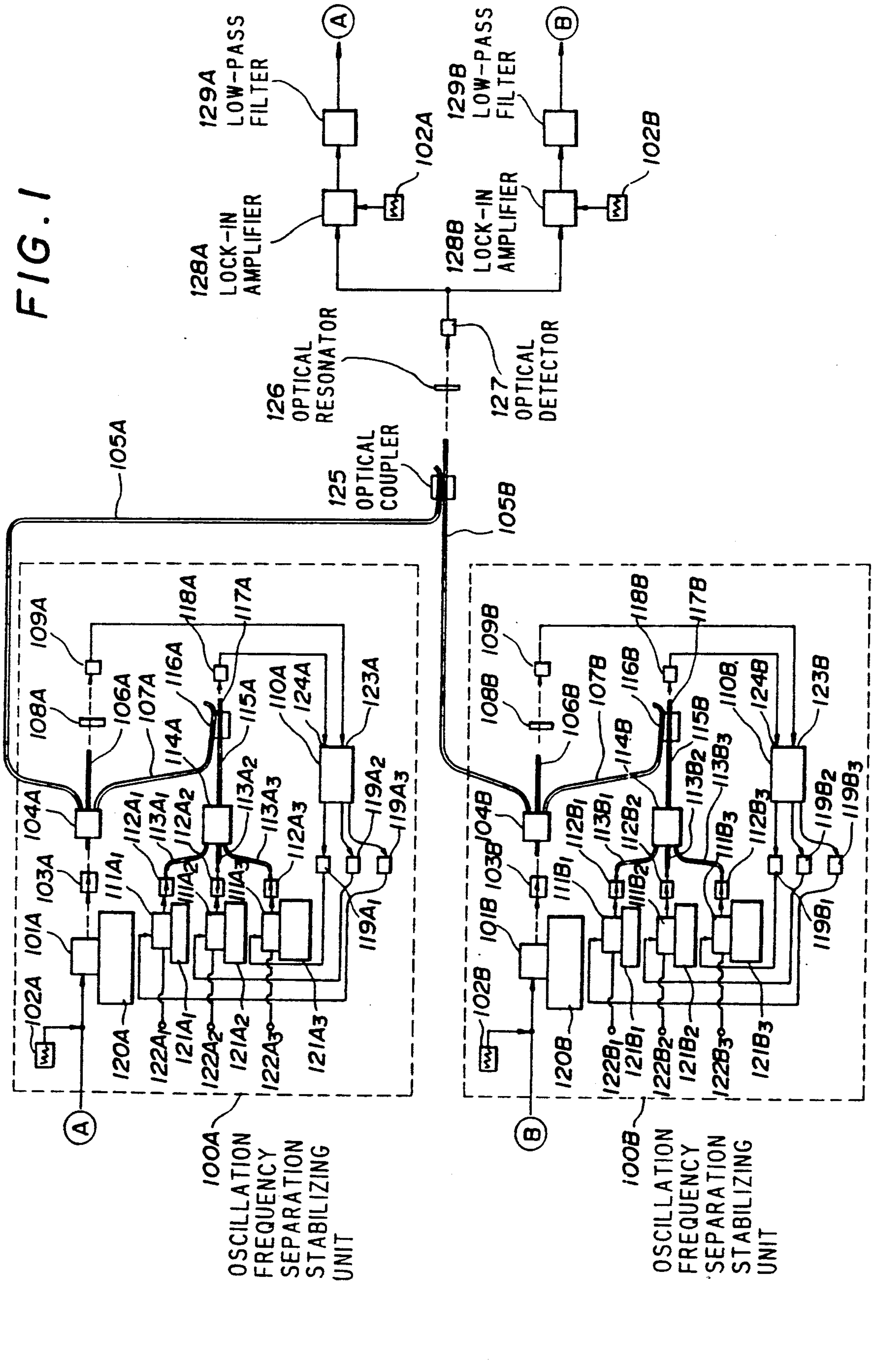
FIG. 1 is a block diagram showing an apparatus for stabilizing oscillation frequency separation among a plurality of laser devices in a first preferred embodiment according to the invention.

FIG. 1 shows an apparatus for stabilizing oscillation frequency separation among a plurality of laser devices in a first preferred embodiment according to the invention. The apparatus comprises two oscillation frequency separation stabilizing units 100A and 100B in each of which stabilization of oscillation frequency separation of a plurality of laser devices is carried out, an optical coupler 125, an optical resonator (a second etalon plate) 126, an optical detector 127, two lock-in amplifiers 128A and 128B, and two low-pass filters 129A and 129B.

The oscillation frequency separation stabilizing unit 100A comprises a distributed Bragg reflector type of a 1.55 μm band wavelength tunable distributed Bragg reflector (DBR) type semiconductor laser device 101A (defined as "a DBR-LD" hereinafter), a sawtooth wave generator 102A from which a sawtooth wave current is injected into a phase control (PC) region and a DBR region of the DBR-LD 101A, an optical isolator 103A through which a light output of the DBR-LD 101A is passed, an optical divider 104A for dividing the light output from the DBR-LD 101A into three light outputs which are propagated through optical fibers 105A, 106A and 107A, a Fabry-Perot optical resonator (a first etalon plate) 108A having three resonant frequencies (equal to the number of below described laser devices 111A$_1$, 111A$_2$ and 111A$_3$) through which a light output supplied from the optical fiber 106A is passed to produce three light pulses in one period of the sawtooth wave of the sawtooth generator 102A based on the three resonant frequencies, an optical detector 109A for converting the three light pulses supplied from the optical resonator 108A to three electric pulses, the 1.55 μm band distributed feedback type laser devices 111A$_1$, 111A$_2$ and 111A$_3$ (defined as "DFB-LD" hereinafter) with modulation signal input terminals 122A$_1$, 122A$_2$, and 122A$_3$ among which oscillation frequency separation is stabilized and each of which is modulated in the frequency shift keying with a modulation rate of 400 Mb/s and a modulation index of 2.5, optical isolators 112A$_1$,112A$_2$ and 112A$_3$ through which light outputs of the DFB-LDs 111A$_1$, 111A$_2$ and 111A$_3$ are passed, an optical coupler 114A for combining the light outputs propagated through the optical fibers 113A$_1$, 113A$_2$ and 113A$_3$, an optical coupler 116A for combining the light outputs propagated through the optical fibers 107A and 115A, an optical detector 118A for converting the light output thus combined in the optical coupler 116A and propagated through an optical fiber 117A to an electric signal, a control unit 110A for producing error signals in accordance with the electric signals received at input terminals 123A and 124A, laser device driving circuits 119A$_1$, 119A$_2$ and 119A$_3$ for driving the DFB-LDs 111A$_1$, 111A$_2$ and 111A$_3$ to stabilize the oscillation frequency separation, and temperature controlling means 120A, 121A$_1$, 121A$_2$, 122A$_2$ and 121A$_3$ on which the DBR-LD 101A, and the DFB-LDs 111A$_1$, 111A$_2$ and 111A$_3$ are mounted and in which the temperatures of these laser devices are stabilized within the temperature range of ±0.1° C., respectively.

The second oscillation frequency separation stabilizing unit 100B has the same structure as that of the first unit 100A, but each part is indicated by the same reference numeral having the letter "B" in place of "A".

Figure 2:
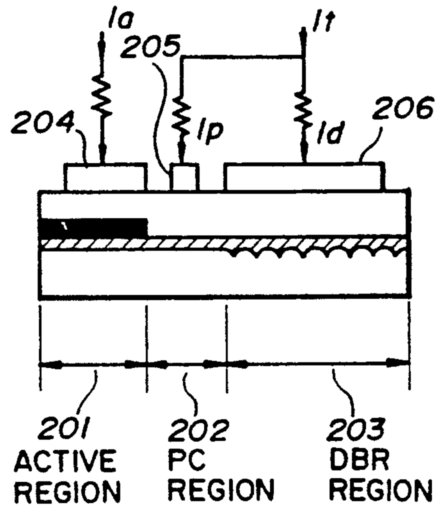
FIG. 2 is a schematic cross-sectional view illustrating a distributed Bragg reflector (DBR) type laser device used in the first preferred embodiment according to the invention.

FIG. 2 shows the structure of the DBR-LD 101A. The structure of the DBR-LD has been described in detail on pages 403 to 405 of "Electronics letters, Apr. 9, 1987, Vol, 23, No. 8". The DBR-LD comprises an active region 201, a PC (phase control) region 202, and a DBR (distributed Bragg reflector) region 203, into which currents Ia, Ip and Id are injected through respective electrodes 204, 205 and 206. The current Ia which is injected into the active region 201 is mainly a current for oscillating the DBR-LD, while the currents Ip and Id (divided dependent on respective resistance values from a total current It) are mainly currents for tuning an oscillation wavelength thereof.

The Fabry-Perot optical resonator 108A has been described in detail in Chapter 4 of "Optical electronics, 1985, authored by Ammon Yariv" published by Halt, Rinehart and Winston Inc. In the first preferred embodiment, an etalon plate made of quartz glass is used as the optical resonator, which has a refractive index of 1.5, a thickness of 1 cm, and a finesse defined by a ratio of an optical resonant frequency separation in regard to a full width at half maximum of an optical pass-band in the center of an optical resonant frequency.

Figure 3:
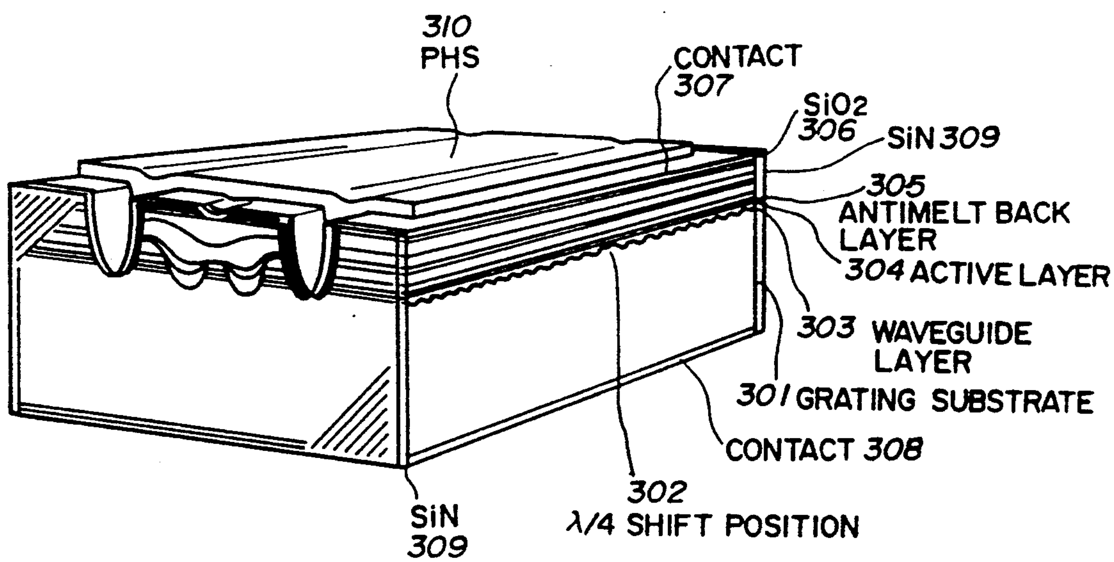
FIG. 3 is a perspective view illustrating a distributed feedback (DFB) type laser device used in the first preferred embodiment according to the invention.

FIG. 3 shows the structure of the DFB-LD used in the first preferred embodiment. The structure of the DFB-LD has been described in detail in the report entitled "Highly stable single longitudinal mode operation in λ/4 shift 1.5 μm DFB-DC-PBH LDs" on pages 29 to 32 of "12th European Conference on Optical Communication, Technical Digest, Vol. 1, Sep. 22/25, 1986". The DFB-LD comprises a first order InP grating substrate 301 including a λ/4 shift position 302, a waveguide layer 303, an active layer 304, an anti-meltback layer 305, and a $SiO_2$ film 306, and further comprises contacts 307 and 308 respectively provided on the top surface of layers sequentially grown on the grating substrate 301 and the back surface thereof, SiN films 309 provided on both side facets thereof, and a PHS layer 310 provided on the contact 307.

Figure 4:
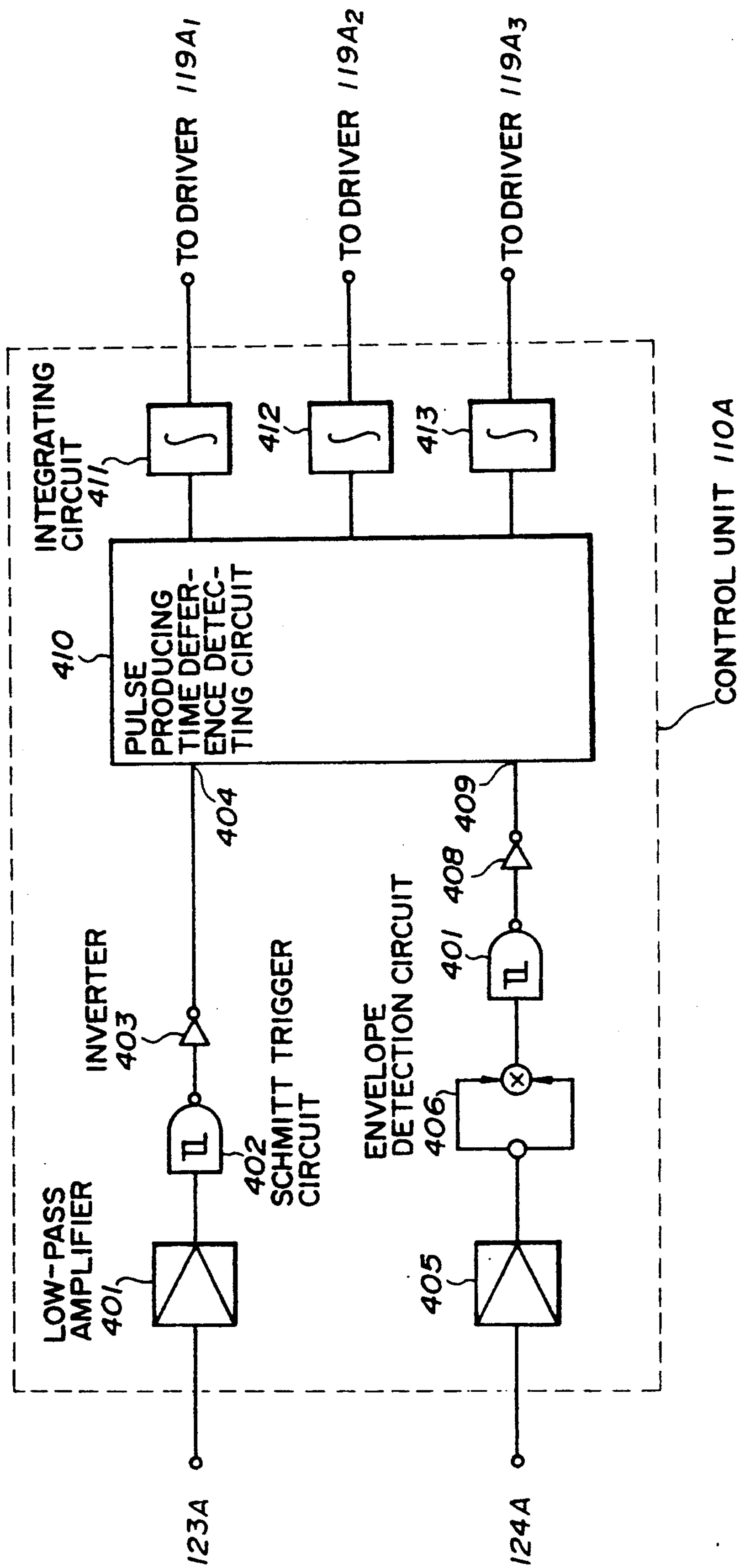
FIG. 4 is a block diagram showing a control unit in the first preferred embodiment according to the invention.

FIG. 4 shows a block diagram of the control unit 110A. The control unit 110A comprises a low-pass amplifier 401 for amplifying electric signals of pulses received through the terminal 123A from the first unit optical detector 109A, a Schmitt trigger circuit 402 for producing logic signals each having a predetermined logic level in accordance with the outputs of the low-pass amplifier 401, an inverter 403 for inverting the logic signals, a low-pass amplifier 405 with a cut-off frequency of 100 MHz and a function of a low-pass filter for producing electric signals which are called "beat pulses" when the frequency difference of the output lights between the DBR-LD 101A and the DFB-LDs 111A$_1$, 111A$_2$ and 111A$_3$ is in the range of approximately ±100 MHz, an envelope detection circuit 406 in which the beat pulses are subject to an envelope detection, a Schmitt trigger circuit 401 for producing logic signals in accordance with the outputs of the envelope detection circuit 406, and an inverter 408 for inverting the logic signals, a pulse producing time deference detecting circuit 410 for detecting the difference of pulse producing times between the reference pulses and the beat pulses in accordance with the logic signals received at terminals 404 and 409 thereof, and integrating circuits 411, 412 and 413 for integrating a pulse producing time difference which is detected in the pulse producing time deference detecting circuit 410 to be supplied to the aforementioned drivers 119A$_1$, 119A$_2$ and 119A$_3$.

Figure 5:
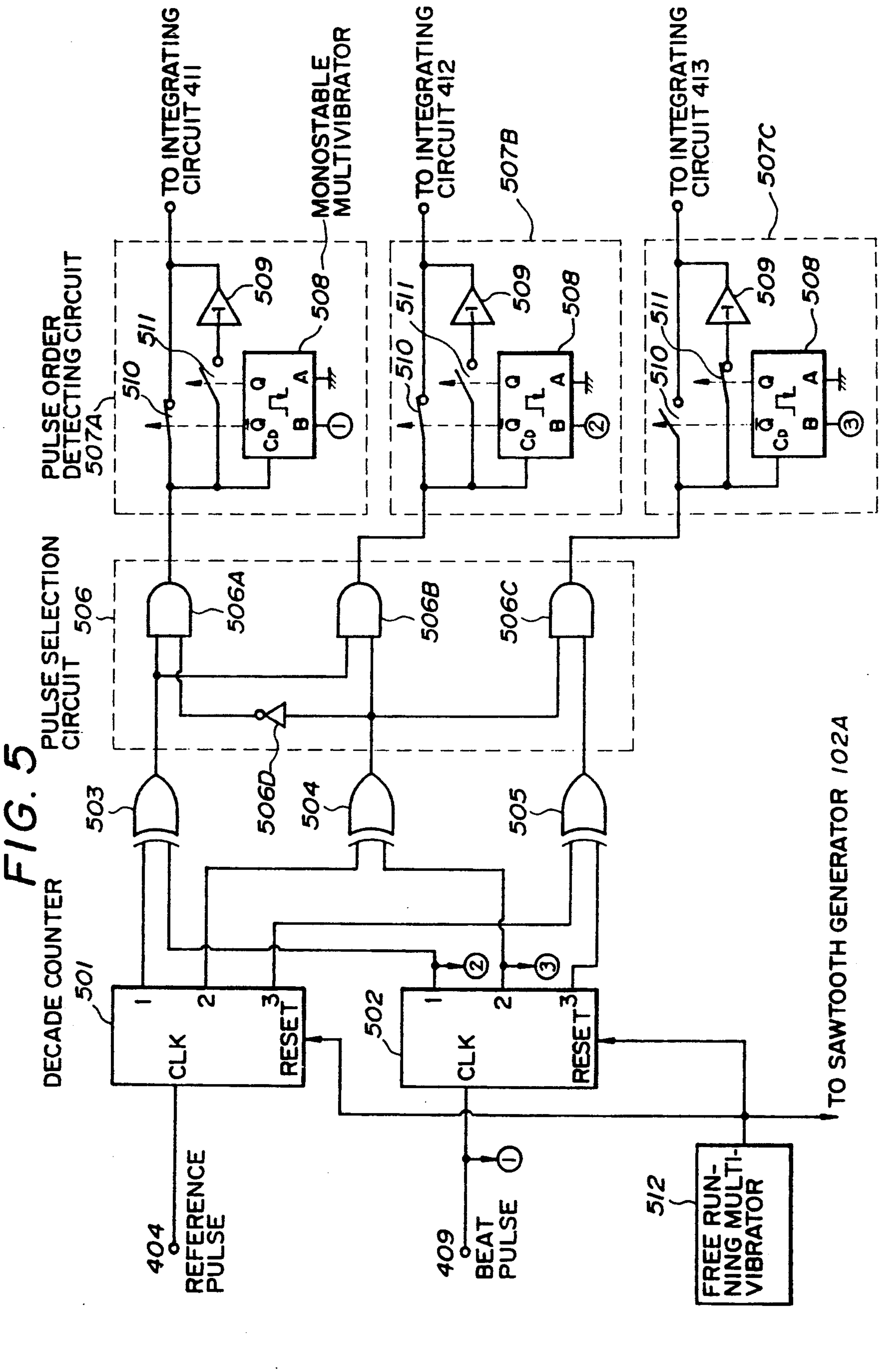
FIG. 5 is a circuit diagram showing a circuit for detecting the difference of pulse producing times in the first preferred embodiment according to the invention.

FIG. 5 shows the pulse producing time deference detecting circuit 410, which comprises a first decade counter 501 having a CLK input terminal for receiving the reference pulses at the terminal 404, and three output terminals 1 to 3 from which a series of square waves each becoming "high" by a reference pulse and "low" by a following reference pulse except for the output terminal 3 where a square wave becomes "high" by a reference pulse and "low" by the end of one period of a sawtooth wave received at a Reset terminal thereof are supplied sequentially, a second decade counter 502 which is the same function as the first decade counter 501 except that the beat pulses are received at the terminal 409, exclusive OR circuits 503 to 505 each connected through two input terminals to the corresponding output terminals 1, 2 or 3 of the first and second decade counters 501 and 502, a pulse selection circuit 506 including AND circuits 506A, 506B and 506C and an inverter 506D for selecting the passing of signals from the exclusive OR circuits 503 to 505 therethrough to the next stage, first to third pulse order detecting circuits 507A, 507B and 507C each detecting a pulse producing order between the reference pulse and the beat pulse, and a free running multi-vibrator 512 connected to the Reset terminals of the first and second decade counters 501 and 502 and to the sawtooth wave generator 102A. Each of the first to third pulse order detecting circuits 507A, 507B and 507C includes a monostable multi-vibrator 508, a polarity reversing circuit 509, and switches 510 and 511 which are turned on and off by outputs of terminals $\overline{Q}$ and O of the monostable multi-vibrator 508. In the pulse order detecting circuit 507A, the multi-vibrator 508 is connected at terminal $C_D$ to the pulse selection circuit 506 and at terminal B to the output terminals 1 and 2 of the second decade counter 502, respectively.

Figure 6:
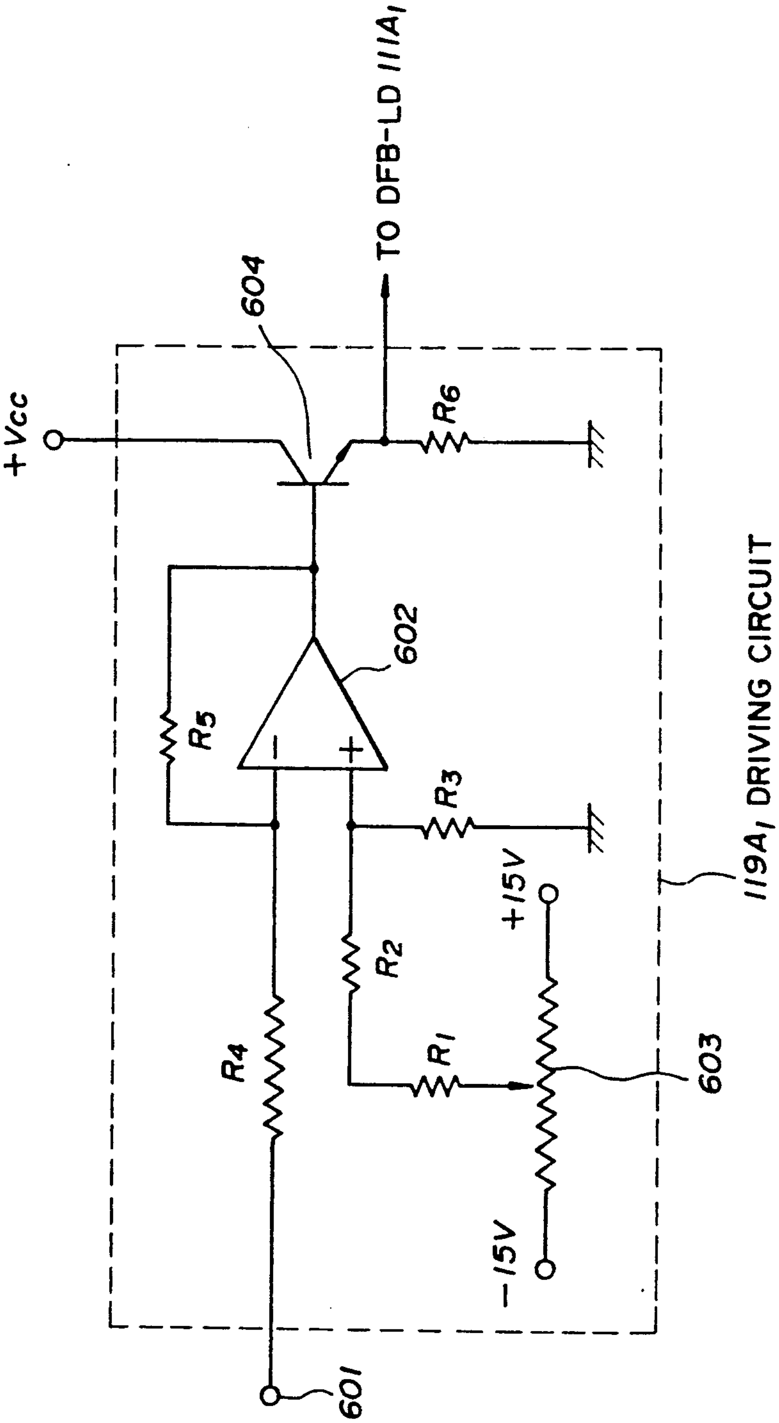
FIG. 6 is a circuit diagram showing a laser device driving means for driving the DFB type laser device in the first preferred embodiment according to the invention.

FIG. 6 shows the laser device driving circuit $\mathbf{119A_1}$ for driving the DFB-LD $\mathbf{111A_1}$ in accordance with the output of the integrating circuit 411 received at a terminal 601. The laser device driving circuit $\mathbf{119A_1}$ comprises an operational amplifier 602 having a positive terminal connected through resistances $R_1$ and $R_2$ to a reference voltage means 603 and through a resistance $R_3$ to the ground and a negative terminal connected through a resistance $R_4$ to the terminal 601 and to a feedback resistance $R_5$, and a driving transistor 604 with a base connected to the operational amplifier 602, a collector connected to a power source +Vcc, and an emitter connected to the DFB-LD $\mathbf{111A_1}$ and through a resistance $R_5$ to ground.

Figure 7:
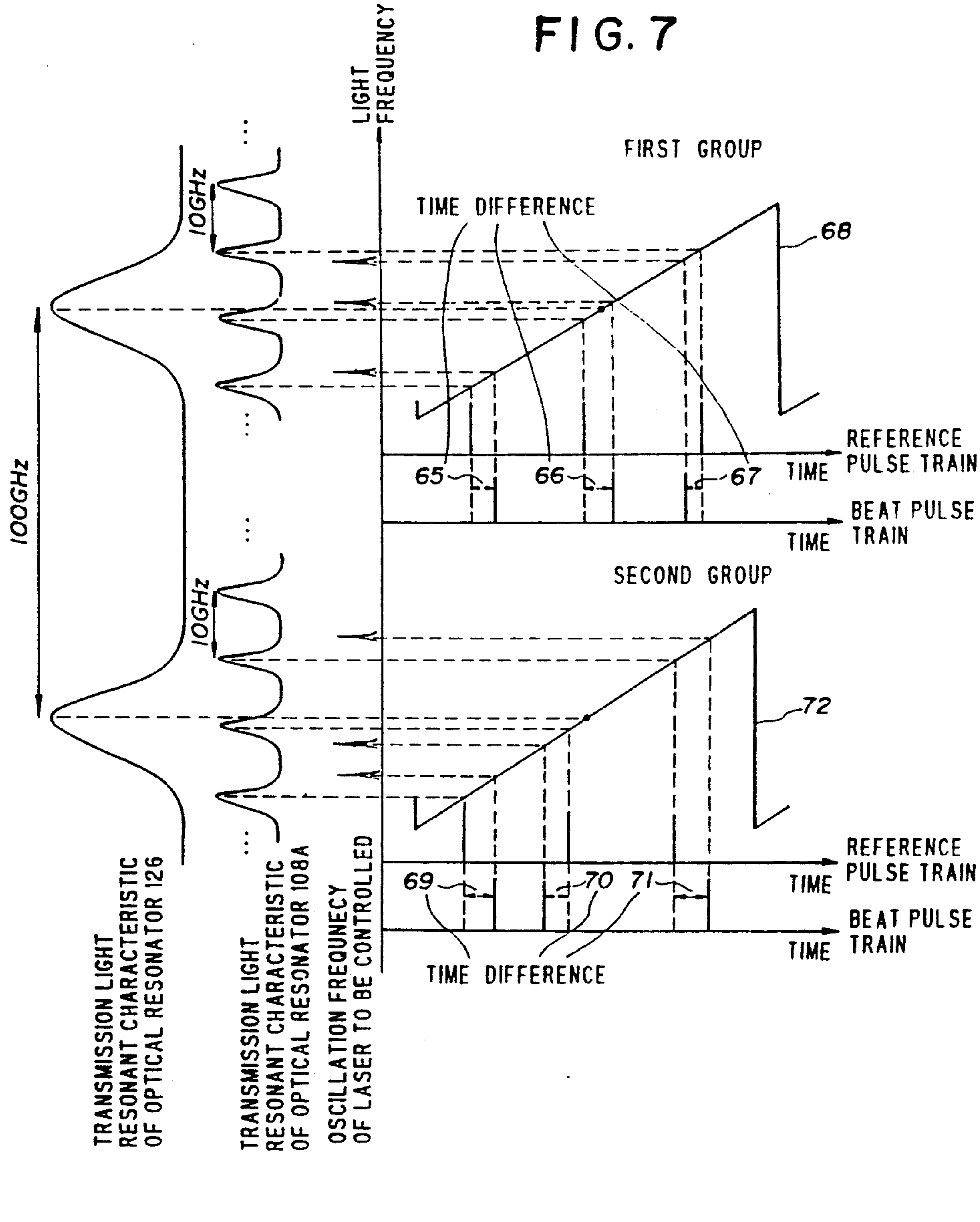
FIG. 7 is a diagram explaining relationships sweeping ranges of the frequencies of each of reference laser devices, the oscillation frequencies of the standard pulses and the beat pulses, and the pulse producing times in the first preferred embodiment according to the invention.

In operation, FIG. 7 shows relations among sweeping ranges of the frequencies of each reference laser device. In the first oscillation frequency separation stabilizing unit 100A, the frequency of the output light of the DBR-LD 101A changes relatively at times in accordance with a signal 68 which is a sawtooth wave having a repetition frequency of 2 KHz supplied from the sawtooth wave generator 102A. A light emitted from the DBR-LD 101A passes through the optical isolator 103A, and is then divided into three light outputs, namely first, second and third light outputs, to provide 1:1:1 power ratio division by the optical divider 104A. The first light output which is propagated through the optical fiber 106A passes through the optical resonator 108A, and is then supplied to the optical detector 109A. The optical detector 109A is supplied with light pulses when the frequency of the light output of the DBR-LD 101A becomes equal to the resonance frequency of the optical resonator 108A. A peak voltage of an output of the sawtooth wave generator 102A is adjusted so that the optical detector 109A is supplied with three light pulses in each cycle of the sawtooth wave supplied from the sawtooth wave generator 102A. Then, an electric signal detected by the optical detector 109A is supplied to the input terminal 123A of the control unit 110A. On the other hand, light outputs emitted from the DFB-LDs $\mathbf{111A_1}$, $\mathbf{111A_2}$ and $\mathbf{111A_3}$ pass through the isolators $\mathbf{112A_1}$, $\mathbf{112A_2}$ and $\mathbf{112A_3}$, respectively, and are then combined together by the optical coupler 114A. The second light output from the optical divider 104A and the light output from the optical coupler 114A are then combined together by the optical coupler 116A. The combined light output of the optical coupler 116A is converted into an electric signal by the optical detector 118A. The electric signal is supplied to the input terminal 124A of the control unit 110A. On the other hand, the sawtooth wave generator 102B generates a sawtooth wave 72 having a repetition frequency of 2.1 KHz to be injected into the DBR-LD 101B. In addition, the resonant frequency separation of the optical resonator 126 which is 100 GHz is wider than that of the optical resonator 108A which is 10 GHz.

Figures 8A, 8B, 8C, 8D, 8E, 8F, 8G, 8H:
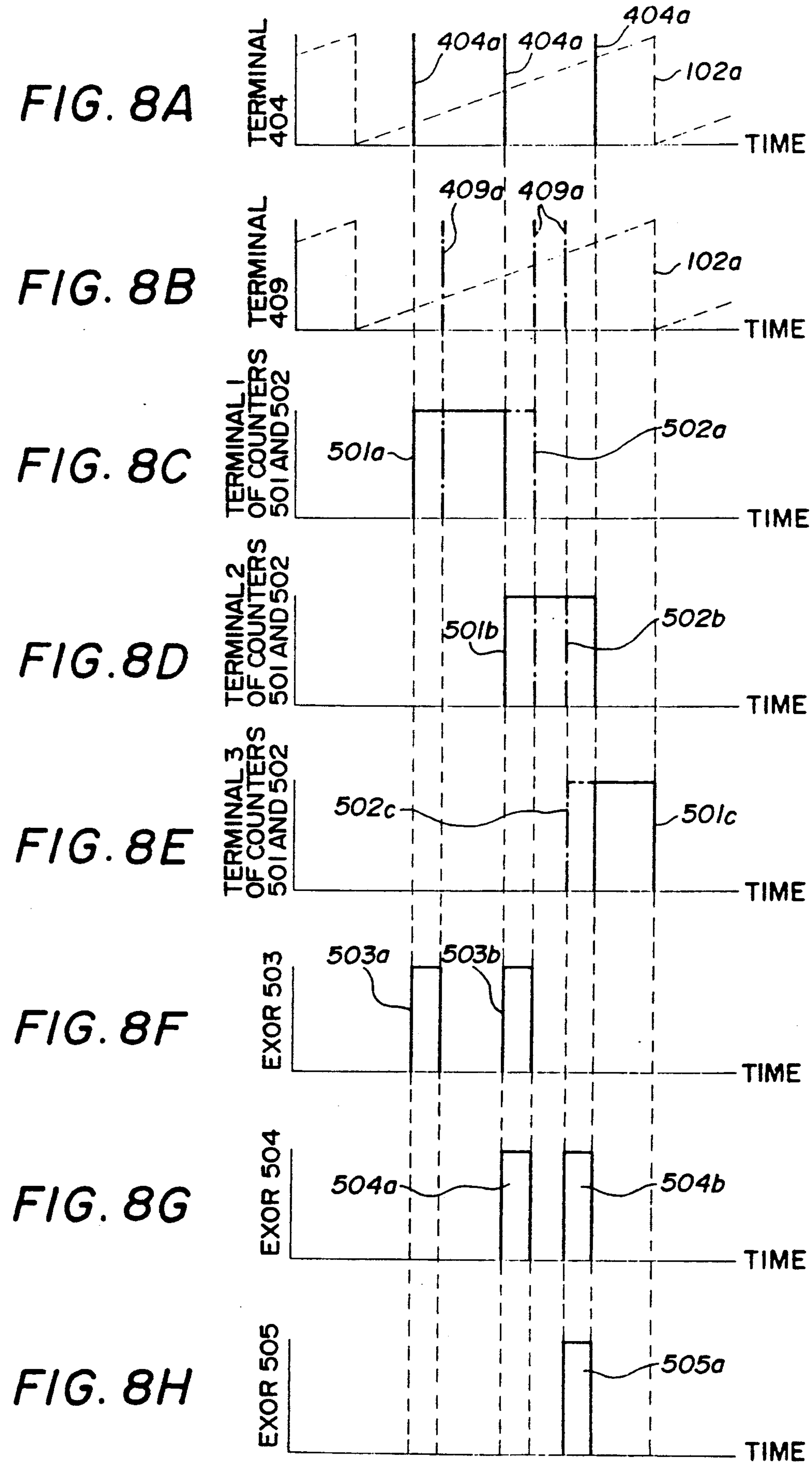
FIGS. 8A to 8M are timing charts explaining operation in the first preferred embodiment according to the invention.

More precisely, the DBR-LD 101A is driven with current Ia injected into the active region 201 which includes a bias current of 50 mA and a sawtooth wave current **102*a* (as shown in FIGS. 8A and 8B) having a repetition frequency of 2 KHz and a current range of 0 to 5.4 mA supplied from the sawtooth wave generator 102A, and with current It injected into the PC and DBR regions 202 and 203 which includes only a sawtooth wave current 102*a* having the same repetition frequency and current range as those for the active region 201 so that a sweep of an oscillation wavelength is performed in the DBR-LD 101A by a width of 45 GHz, and the injection of the sawtooth wave current 102*a* into the DBR-LD 101A compensates an absorption loss which is induced in the PC and DBR regions 202 and 203 by the injection of the sawtooth wave current 102*a* thereinto and refrains from the fluctuation of output light emitted from the DBR-LD 101A. The output light of the DBR-LD 101A is passed through the optical isolator 103A and then divided to be propagated through the optical fibers 105A, 106A and 107A by the optical divider 104A. The output light of the optical fiber 106A is supplied to the optical resonator 108A so that the three output lights of pulses are produced in one period of the sawtooth wave, when an oscillation frequency of the DBR-LD 101A coincides with the three resonant frequencies of the optical resonator 108A. Three output lights thus produced are converted in the optical detector 109A to the three electric signals which are then supplied to the terminals 123A of the control unit 110A. Simultaneously, the DFB-LDs $\mathbf{111A_1}$, $\mathbf{111A_2}$ and $\mathbf{111A_3}$ are driven to emit output lights which are passed through the optical isolators $\mathbf{112A_1}$, $\mathbf{112A_2}$ and $\mathbf{112A_3}$ by the laser device driving circuits $\mathbf{119A_1}$, $\mathbf{119A_2}$ and $\mathbf{119A_3}$, respectively. The output lights which passed through the optical isolators $\mathbf{112A_1}$, $\mathbf{112A_2}$ and $\mathbf{112A_3}$ are propagated through the optical fibers $\mathbf{113A_1}$, $\mathbf{113A_2}$ and $\mathbf{113A_3}$, and then combined in the optical coupler 114A. The light output supplied from the optical coupler 114A is progagated through the optical fiber 115A and then combined in the optical coupler 116A with the light output of the optical fiber 107A. The combined light output from the optical coupler 116A is propagated through the optical fiber 117A, and then converted in the optical detector 118A into electric signals which are supplied to the input terminal 124A of the control unit 110A**.

In the control unit 110A, the electric signals of pulses received at the input terminal 123A from the optical detector 109A are amplified in the low-pass amplifier 401 and then converted in the Schmitt trigger circuit 402 to logic signals. The polarity of the logic signals is inverted to be applied to the input terminal 404 of the pulse producing time deference detecting circuit 410. The inverted logic signals are called "the first to third reference pulses **404*a*" as shown in FIG. 8A. The electric signals received at the input terminal 124A from the optical detector 118A are supplied to the low-pass amplifier 405 in which the three electric signals of pulses are produced to be beat signals when the difference of frequencies between the output light of the DBR-LD 101A and the output lights of the DFB-LDs $\mathbf{111A_1}$, $\mathbf{111A_2}$ and $\mathbf{111A_3}$ is in the range of $\pm 100$ MHz so that the three pulses are obtained therein. The three pulses are subject to an envelope detection in the envelope detection circuit 406 and then converted in the Schmitt trigger circuit 401 to logic signals which are then inverted in the inverter 408. The inverted logic signals are applied to the input terminal 409 of the pulse producing time deference detecting circuit 410 and shown to be "the first to third beat signals 409*a*" in FIG. 8B**.

In the circuit 410, the first to third reference pulses **404*a* are applied to the decade counter 501, and the first to third beat pulses 409*a* are applied to the decade counter 502. In the decade counter 501**, the first square wave 501a is produced at the terminal 1 during the time interval between the first and second reference pulses 404a as shown in FIG. 8C, the second square wave 501b is produced at the terminal 2 during the time interval between the second and third reference pulses 404a as shown in FIG. 8D, and the third square wave 501C is produced at the terminal 3 during the time interval between the third reference pulse 404a and the start of the next sawtooth wave signal 102a as shown in FIG. 8E. In the same manner, the first to third square waves 502a, 502b and 502c are produced at the terminals 1, 2 and 3 in accordance with the first to third beat pulses 409a and the sawtooth wave signal 102a as shown in FIGS. 8C, 8D and 8E. Outputs of the terminals 1 of the decade counters 501 and 502 are supplied to the exclusive OR circuit 503, and those of the terminals 2 and 3 of the decade counters 501 and 502 are supplied to the exclusive OR circuits 504 and 505 respectively. Outputs of those exclusive OR circuits 503, 504 and 505 produced in the following truth table are shown in FIGS. 8F to 8H by reference numerals 503a, 503b, 504a, 504b and 505a supplied to the pulse selection circuit 506.

| INPUT | | OUTPUT |
|---|---|---|
| 0 | 0 | 0 |
| 0 | 1 | 1 |
| 1 | 0 | 1 |
| 1 | 1 | 0 |

Figures 8I, 8J, 8K, 8L, 8M:
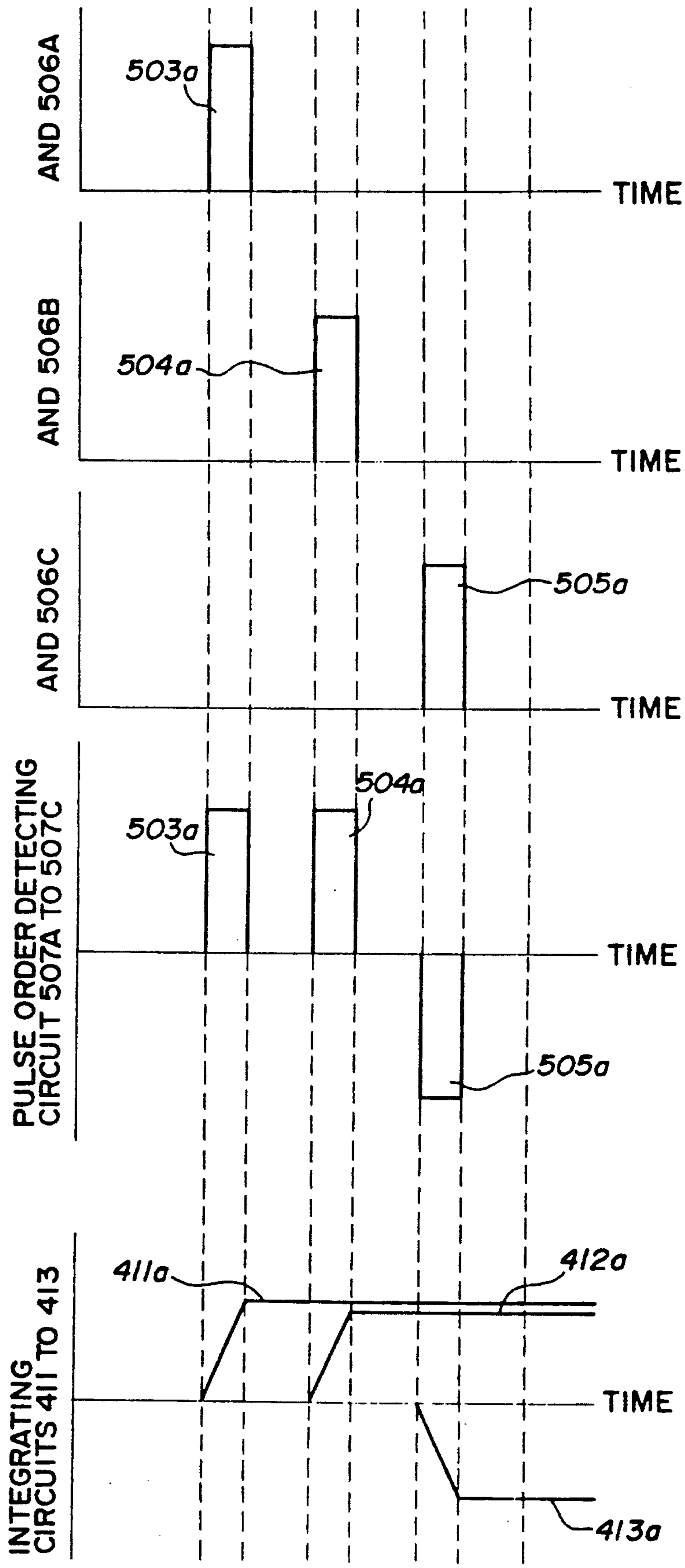

In the first AND circuit 506A, the pulse 503a is passed therethrough, while the pulse 503b is stopped to be passed therethrough as shown in FIG. 8I. That is, the earlier producing pulse 503a is only passed through the first AND circuit 506A in a case where the pulses 503a and 503b are supplied thereto. In the same manner, only the pulse 504a is passed through the second AND circuit 506B as shown in FIG. 8J, while the single pulse 505a is passed through the third AND 506C as shown in FIG. 8K. The pulses 503a, 504a and 505a thus passed through the pulse selection circuit 506 are supplied to the first to third pulse order detecting circuits 507A, 507B and 507C. In the first pulse order detecting circuit 507A, the switch 510 is turned on, and the switch 511 is turned off for the reason that the terminals Q and $\overline{Q}$ of the multi-vibrator 508 are "low" and "high" respectively, and a signal applied to the terminal B thereof is "low" when the pulse 503a is applied to the terminal $C_D$ thereof so that the pulse 503a is supplied through the switch 510 to the integrating circuit 411 as shown in FIG. 8L. When the pulse 503a becomes "low", the first beat pulse 409 is applied to the terminal B of the the multi-vibrator 508.

In this case, the terminal $C_D$ (corresponding to an enable terminal) is also "low", so that the terminals Q and $\overline{Q}$ of the multi-vibrator 508 do not change even if the first beat pulse 409 is supplied to the terminal B. However, if the beat pulse 409a is generated earlier than the reference pulse 404a, the terminal $C_D$ becomes "high" when the signal 503a becomes "high", and simultaneously the terminal B is supplied with the first beat pulse 409. In this case, the multi-vibrator 508 operates when the first beat pulse 409 is in declined state, so that the terminal Q becomes "high" from "low", and the terminal $\overline{Q}$ becomes "low" from "high". As a result, the switch 511 becomes ON state, so that the inverting amplifier 509 starts operating, and the pulse order detecting circuit 507A produces a negative pulse.

This means that a pulse is passed through the pulse order detecting circuit 507A when the first reference signal 404a is produced earlier than the first beat signal 409a, while a pulse is inverted to be passed therethrough when the first reference signal 404a is produced later than the first beat signal 409a. In the second pulse order detecting circuit 507B, the pulse 504b is passed therethrough without being inverted, as shown in FIG. 8L, because the square wave signal 502a (as shown in FIG. 8C) becomes "low" when the pulse 504b becomes "low". In the third pulse order detecting circuit 507C, the pulse 505a is inverted to be passed therethrough as shown in FIG. 8L for the reason that the square wave signal 502b is applied to the terminal B of the multi-vibrator 508 before the pulse 505a is applied to the terminal $C_D$ thereof so that the switch 510 is turned off, and the switch 510 is turned off when the square wave signal 502b becomes "low". The non-inverted pulses 503a and 504a and the inverted pulse 505a are integrated in the integrated circuits 411 to 413 during each two or three periods of the sawtooth waves 102a respectively to provide integrated values 411a, 412a and 413a as shown in FIG. 8M. Then integrated values 411a, 412a and 413a are applied to the laser device driving circuits $119A_1$, $119A_2$ and $119A_3$, respectively. In the laser device driving circuits $119A_1$, the integrated value 411a is applied to the terminal 601 thereof so that the operational amplifier 602 controls the driving transistor 604 to drive the DFB-LD $111A_1$ in accordance with the difference between the integrated value 411a and the reference value obtained from the reference voltage means 603. As a result, the DFB-LD $111A_1$ is driven by the driving current supplied from the driving transistor 604 which is added to a biased current. This means that the DFB-LDs $111A_1$, $111A_2$ and $111A_3$ are controlled to emit light outputs having a predetermined frequency separation thereby minimizing the time difference between the aforementioned reference and beat pulses. As clearly understood from the above descriptions, a frequency separation is stabilized strictly in the same value as a free-spectrum range of the optical resonator among a plurality of laser devices in the oscillation frequency separation stabilizing unit 100A.

The same operation is carried out in the second oscillation frequency separation stabilizing unit 100B as in the first oscillation frequency separation stabilizing unit 100A as explained above.

Next, the third divided light outputs of the optical dividers 104A and 104B of the first and second oscillation frequency separation stabilizing units 100A and 100B are propagated through the optical fibers 105A and 105B to be combined in the optical coupler 125, and the combined light output from the optical coupler 125 is then supplied to the optical resonator 126 having a free spectrum range of 100 GHz. The light output passes through the optical resonator 126 and is converted into an electric signal by the optical detector 127. The electric signal is divided into first and second electric signals. The first divided electric signal is supplied to the lock-in amplifier 128A, in which the first electric signal is detected synchronously with a sawtooth wave signal 68 of the sawtooth wave generator 102A, as shown in FIG. 7. The output signal of the lock-in amplifier 128A is supplied to the low-pass filter 129A, through which a low frequency component of the signal is supplied to the DBR-LD 101A.

Figure 9A:
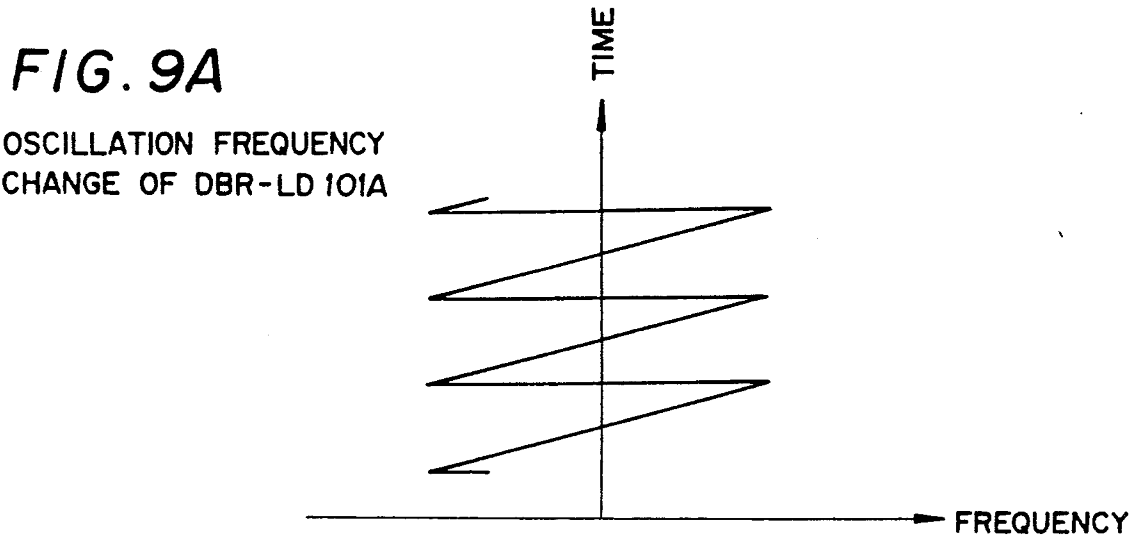
FIGS. 9A to 9C are diagrams explaining relationships between frequencies and detecting outputs of the lock-in amplifier in the first preferred embodiment according to the invention.
Figure 9B:
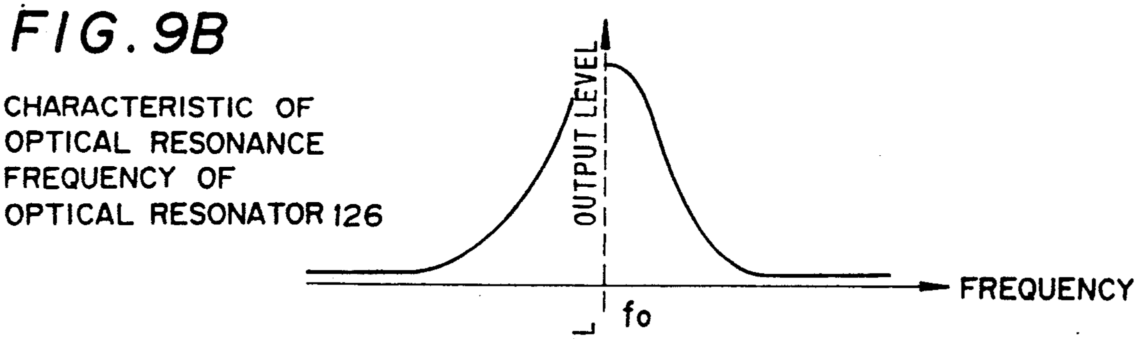
Figure 9C:
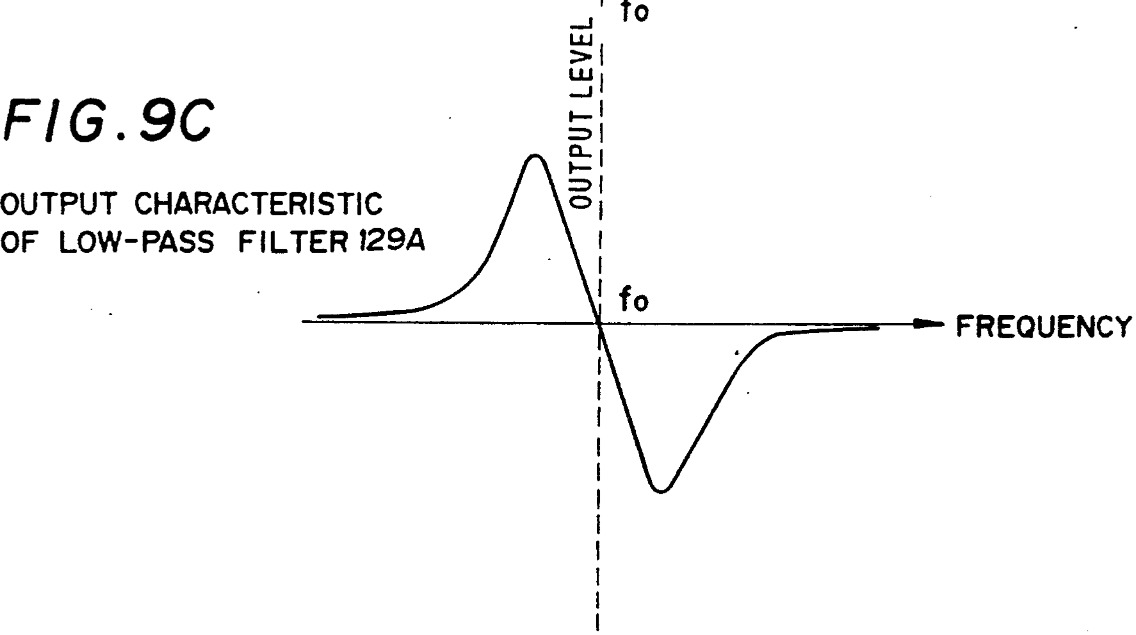

FIGS. 9A to 9C explain detecting outputs of the lock-in amplifier 128A. The oscillation frequency of the DBR-LD 101A changes relatively to time due to the sweep of the sawtooth wave as shown in FIG. 9A, and the optical resonator 126 generates an output changing dependent on the change of the oscillation frequency of the DBR-LD 101A as shown in FIG. 9B. This low frequency component corresponds to a primary differentiated value of a transmission resonance characteristic of the optical resonator 126 as shown in FIG. 9C. That is, if an averaged oscillation center frequency of the DBR-LD 101A shifts on the lower frequency side relative to the peak resonance frequency $f_0$ of the optical resonator 126, the output of the low-pass filter 129A becomes a positive value. On the other hand, if an averaged oscillation center frequency of the DBR-LD 101A shifts on the higher frequency side relative to the peak resonance frequency $f_0$ of the optical resonator 126, the output of the low-pass filter 129A becomes a negative value. Accordingly, the averaged oscillation center frequency of the DBR-LD 101A is stabilized at the transmitting peak frequency of the optical resonator 126 by a feedback of the output of the low-pass filter 129A to the bias current of the sawtooth wave generator 102A which applies the sawtooth wave to the DBR-LD 101A so that the output of the low-pass filter 129A becomes zero. The same operation is carried out in the second oscillation frequency separation stabilizing unit 100B with the lock-in amplifier 128B and the low-pass filter 129B. As a result, the frequency separation of the two reference laser devices 101A and 101B are stabilized.

In such a manner as explained above, the oscillation frequencies of the three transmitting DFB-LDs of each unit are not only stabilized by the frequency separation which is equal to the free spectrum range of the optical resonator 108A or 108B, but a relative frequency separation is stabilized between the two units 100A and 100B.

Figure 10:
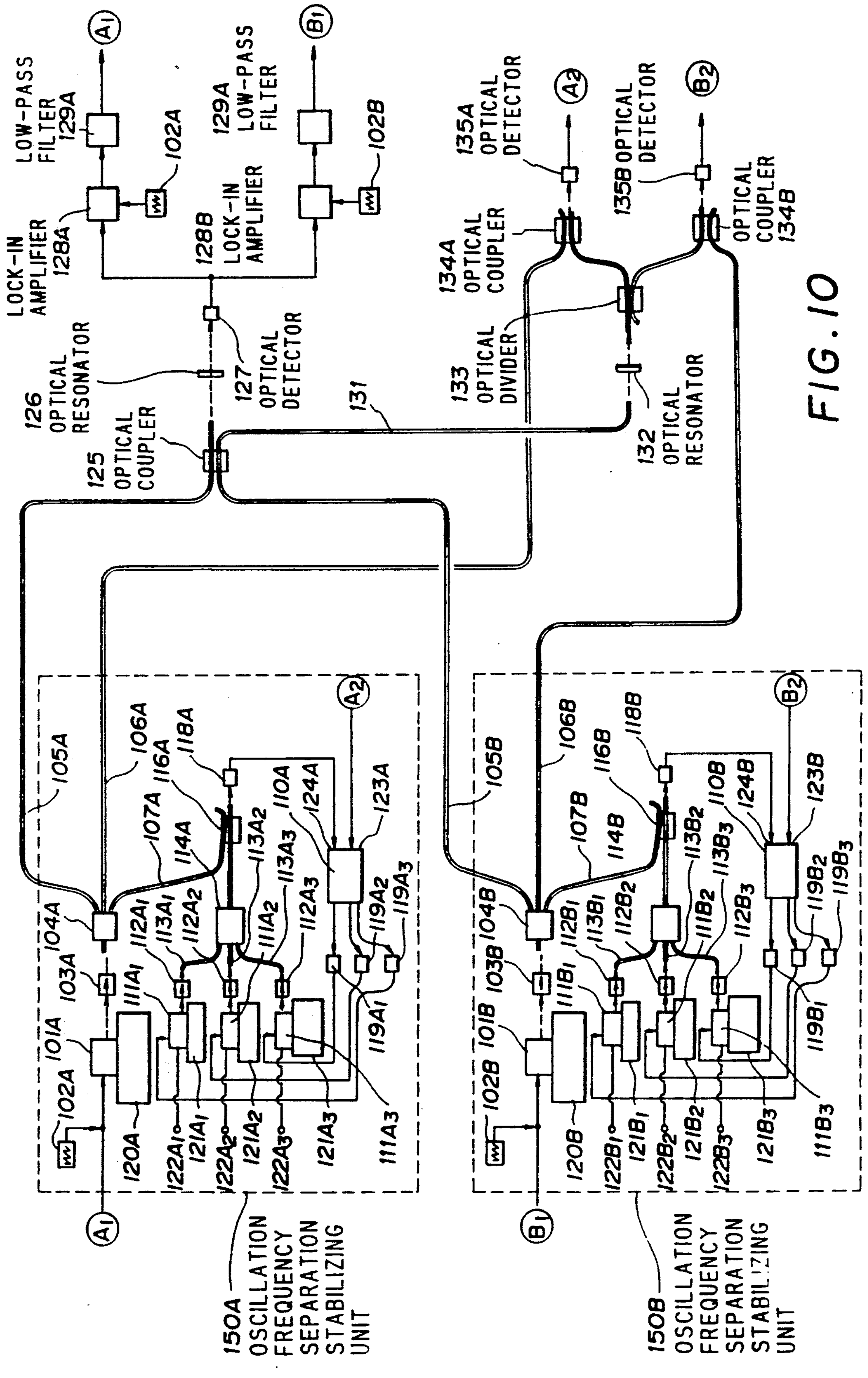
FIG. 10 is a block diagram showing an apparatus for stabilizing oscillation frequency separation among a plurality of laser devices in a second preferred embodiment according to the invention.

FIG. 10 shows an apparatus for stabilizing oscillation frequency separation among a plurality of laser devices in a second preferred embodiment according to the invention. The apparatus comprises two oscillation frequency separation stabilizing units 150A and 150B, optical couplers 125, 134A and 134B, optical resonators 126 and 132, optical detectors 127, 135A and 135B, an optical divider 133, lock-in amplifiers 128A and 128B, and low-pass filters 129A and 129B.

The structure of the oscillation frequency separation stabilizing units 150A and 150B is the same as that of the oscillation frequency separation stabilizing units 100A and 100B in FIG. 1, except that an optical resonator and an optical detector corresponding to the optical resonator 108A or 108B and the optical detector 109A or 109B are not, respectively, provided in the second preferred embodiment.

In operation, each one of divided light outputs of the optical dividers 104A and 104B are combined and then divided into first and second light outputs in the optical coupler 125. The first light output passes through the optical resonator 126 to produce a reference light output which is converted in the optical detector 127 into an electric signal to be used for stabilizing of frequency separation of the reference laser devices 101A and 101B. The electric signal is supplied to the lock-in amplifiers 128A and 128B, and the low-pass filters 129A and 129B to provide the same operation in the first preferred embodiment.

The second light output of the optical coupler 125 is propagated through the optical fiber 131, and then passes through the optical resonator 132. Then, the light output of the optical resonator 132 is divided into two light outputs to be supplied to the optical coupler 134A and 134B, respectively. In each of the optical couplers 134A and 134B, a corresponding light output from the optical divider 133 and a corresponding light output from the optical dividers 104A and 104B are combined, and the combined light signals are then converted into electric signals in the optical detectors 135A and 135B, respectively. The electric signals are supplied to the control units 110A and 110B, respectively. In this embodiment, the frequency separation of each group of the three laser devices is stabilized by the optical resonator 132, and a self-homodyne detection receiving is carried out in each of the optical detectors 135A and 135B.

In the first and second preferred embodiments, the DBR-LDs and the DFB-LDs are stabilized to be kept within ±0.1° C. of a predetermined temperature by the temperature controlling apparatus. The number of the DFB-LDs is not limited to "3", but may be changed, if the range of oscillation frequencies is within a swept frequency range. The number of the oscillation frequency separation stabilizing units may be also changed dependent on a resolution power of the lock-in amplifiers and a response speed of the control units. The frequency separation can be freely changed by changing a thickness of the etalon plate which is used for the optical resonator. A laser device to be controlled is not limited to a semiconductor laser device, but a laser device having an oscillation frequency which changes dependent on an applied external signal may be used. The lock-in amplifier may be replaced by an analog-operationable balance type mixer, a digital-operationable exclusive OR circuit, etc. having a detection function. The sawtooth wave which is used for the sweeping operation may be replaced by a triangle wave, a sine wave, etc.

Although the invention has been described with respect to specific embodiment for complete and clear disclosure, the appended claims are not to thus limited and alternative constructions that may occur to one skilled in the art which fairly fall within the basic teaching herein set forth.

What is claimed is:

1. A method for stabilizing oscillation frequency separation among a plurality of laser devices, comprising:

(a) sweeping oscillation frequencies of a plurality of reference laser devices in accordance with sweeping signals generated by a plurality of sweeping signal generators, whereby said reference laser devices emit a plurality of light outputs having plural swept frequency ranges;

(b) dividing each of said light outputs emitted from each of said reference laser devices into first, second and third divided light outputs, respectively;

(c) combining said first divided light outputs to produce a first combined light output;

(d) passing said first combined light output through a first optical resonator having plural resonant frequencies to produce a first reference light output at said plural resonant frequencies, an interval between said plural resonant frequencies of said first optical resonator being equal to a predetermined oscillation frequency separation among said reference laser devices;

(e) converting said first reference light output into a first train of reference electric pulses;

(f) dividing said first train of reference electric pulses into a plurality of first trains of reference electric pulses, the number of first trains of reference electric pulses being equal to the number of said reference laser devices;

(g) detecting said first trains of reference electric pulses with said sweeping signals, respectively, to produce synchronized electric signals;

(h) filtering said synchronized electric signals to provide low frequency components of said synchronized electric signals as reference error signals;

(i) supplying said reference error signals to said plurality of reference laser devices, respectively, to control oscillation frequencies of said reference laser devices such that averaged center frequencies of said reference laser devices are stabilized at transmission peaks of said first optical resonator, respectively;

(j) driving a plural group of transmitting laser devices, each group including a plurality of transmitting laser devices to emit transmitted light outputs having oscillation frequencies in said plural swept frequency ranges;

(k) passing said second divided light outputs emitted from said plurality of reference laser devices through second optical resonators each having plural resonant frequencies to produce second reference light outputs at said plural resonant frequencies, an interval between said plural resonant frequencies of each of said second optical resonators being equal to a predetermined oscillation frequency separation among a plurality of transmitting laser devices in each group;

(l) converting each of said reference light outputs into a second train of reference electric pulses;

(m) combining said third divided light outputs and said transmitted light outputs from said plurality of transmitting laser devices in each group to produce second combined light outputs;

(n) converting said second combined light outputs into combined electric signals;

(o) filtering said combined electric signals to produce a train of beat pulses relative to said oscillation frequencies of said plurality of transmitting laser devices in each group;

(p) comparing occurrence times between said train of beat pulses and said second trains of reference electric pulses to produce a transmitted error signal; and (q) controlling oscillation frequencies of said plurality of transmitting laser devices such that said transmitted error signal is approximately equal to a predetermined value in each group.

2. A method for stabilizing oscillation frequency separation among plural laser devices, comprising:

(a) sweeping oscillation frequencies of a plurality of reference laser devices in accordance with sweeping signals generated by a plurality of sweeping signal generators to emit a plurality of light outputs having plural swept frequency ranges from said reference laser devices;

(b) dividing each of said pluality of light outputs emitted from said reference laser devices into first, second and third divided light outputs, respectively;

(c) combining said first divided light outputs to produce a first combined light output;

(d) passing said first combined light output through a first optical resonator having plural resonant frequencies to produce a first reference light output at said plural resonant frequencies of said first optical resonator, an interval between said plural resonant frequencies of said first optical resonator being equal to a predetermined oscillation frequency separation among said plurality of reference laser devices;

(e) converting said first reference light output into a first train of combined reference electric pulses;

(f) dividing said first train of reference electric pulses into a plurality of first trains of reference electric pulses, the number of first trains of reference electric pulses being equal to the number of reference laser devices;

(g) detecting said plurality of first trains of reference electric pulses with said sweeping signals, respectively, to produce synchronized electric signals;

(h) filtering said synchronized electric signals to provide low frequency components of said synchronized electric signals as reference error signals;

(j) supplying said reference error signals to said plurality of reference laser devices, respectively, to control oscillation frequencies of said pluality of reference laser devices such that averaged center frequencies of said plurality of reference laser devices are stabilized at transmission peaks of said first optical resonator, respectively;

(k) driving plural groups of transmitting laser devices, each group including a plurality of transmitting laser devices which emit transmitted light outputs having oscillation frequencies in said plural swept frequency ranges;

(l) passing said first combined light output through a second optical resonator having plural resonant frequencies to produce second reference light outputs at said plural resonant frequencies of said second optical resonator, an interval between said plural resonant frequencies of said second optical resonator being equal to a predetermined oscillation frequency separation among a plurality of transmitting laser devices in each group;

(m) dividing said second reference light output into a plurality of second divided reference light outputs, the number of second divided reference light outputs being equal to the number of said reference laser devices;

(n) combining said second divided reference light outputs and said second divided light outputs emitted from said reference laser devices to produce third reference light outputs;

(o) converting said third reference light outputs into second trains of reference electric pulses;

(p) combining said third divided light outputs and transmitted light outputs from said plurality of transmitting laser devices in each group to produce second combined light outputs;

(q) converting said second combined light outputs into combined electric signals;

(r) filtering each of said combined electric signals to produce a train of beat pulses relative to said oscillation frequencies of said plurality of transmitting laser devices in each group;

(s) comparing occurrence times between said train of beat pulses and said second trains of reference electric pulses to produce a transmitted error signal; and (t) controlling oscillation frequencies of said plurality of transmitting laser devices such that said transmitted error signal is approximately equal to a predetermined value in each group.

3. An apparatus for stabilizing oscillation frequency separation among a plurality of laser devices comprising:

(a) a plurality of oscillation frequency stabilizing units, each comprising:

(1) means for generating external sweeping signals;

(2) a reference laser device to which said external sweeping signals are supplied, said reference laser device emitting a plurality of light outputs having plural swept frequency ranges;

(3) means for dividing the light output of said reference laser device into at least three light divided light outputs, a first of said divided light outputs being supplied to a reference error signal generating unit, and a second of said divided light outputs being supplied to a second optical resonator having plural resonant frequencies to produce a second reference light output at said periodic resonant frequencies, an interval between said plural resonant frequencies of said second optical resonator being equal to a predetermined oscillation frequency separation among said reference laser devices;

(4) means for converting said second reference light output into a second train of reference electric pulses;

(5) a plurality of transmitting laser devices, each emitting transmitted light outputs having oscillation frequencies in said plural swept frequency ranges;

(6) means for combining said transmitted light outputs from said plurality of transmitting laser devices to produce a combined transmitted light output;

(7) means for combining said combined transmitted light output with a third of said divided light outputs emitted from said reference laser device to produce a second combined light output;

(8) means for converting said second combined light output to an electric signal;

(9) a low pass filter through which a low frequency component of said electric signal is passed to produce beat pulses relative to said oscillation frequencies of said plurality of transmitting laser devices;

(10) means for comparing occurrence timed between said beat pulses and said second train of reference electric pulses to produce a transmitted error signal; and,

(11) means for controlling oscillation frequencies of said plurality of transmitting laser devices such that said transmitted error signal is approximately equal to a predetermined value; and, (b) a reference error signal generating unit comprising:

(1) means for combining said first divided light output and any remaining light outputs to produce a first combined light output;

(2) a first optical resonator having plural resonant frequencies to produce a first reference light output at said plural resonant frequencies, an interval between said plural resonant frequencies of said first optical resonator being equal to a predetermined oscillation frequency separation among said reference laser devices;

(3) means for converting said first reference light output into a first train of reference electric pulses;

(4) a plurality of means for detecting said first trains of said reference electric pulses with said sweeping signals, respectively, to produce synchronized electric signals;

(5) a plurality of low pass filters, each passing a synchronized electric signal to obtain a low frequency component thereof and produce a reference error signal to be supplied to said reference laser devices, the number of said low pass filters being equal to the number of reference laser devices.

4. An apparatus for stabilizing oscillation frequency separation among a plurality of laser devices as claimed in claim 3 wherein said means for generating external sweeping signals is a signal generator selected from a sawtooth wave generator, a triangle wave generator, and a sine wave curve generator.

5. An apparatus for stabilizing oscillation frequency separation among a plurality of laser devices as claimed in claim 3 wherein said transmitting laser device is a semiconductor laser device.

6. An apparatus for stabilizing oscillation frequency separation among a plurality of laser devices as claimed in claim 3 wherein said reference laser device is a DBR-LD.

7. An apparatus for stabilizing oscillation frequency separation among a plurality of laser devices as claimed in claim 3 wherein said transmitting laser device is a DFB-LD.

8. An apparatus for stabilizing oscillation frequency separation among a plurality of laser devices as claimed in claim 3 wherein said first and second optical resonators are Fabrey-Perot optical resonators.

9. An apparatus for stabilizing oscillation frequency separation among a plurality of laser devices as claimed in claim 3 wherein said detecting means are selected from a lock-in amplifier, a balancing type mixer operating in analogue, and an exclusive OR (EX-OR) circuit operating in digital.

10. An apparatus for stabilizing oscillation frequency separation among a plurality of laser devices comprising:

(a) a plurality of oscillation frequency stabilizing units, each comprising:

(1) means for generating external sweeping signals;

(2) a reference laser device to which said external sweeping signals are supplied, said reference laser device emitting a plurality of light outputs having plural swept frequency ranges;

(3) means for dividing the light output of said reference laser device into at least three light divided light outputs, a first of said divided light outputs being supplied to a reference error signal generating unit, and a second of said divided light outputs being supplied to an optical divider unit;

(4) a plurality of transmitting laser devices, each emitting transmitted light outputs having oscillation frequencies in said plural swept frequency ranges;

(5) means for combining said transmitted light outputs from said plurality of transmitting laser devices to produce a combined transmitted light output;

(6) means for combining said combined transmitted light output with a third of said divided light outputs emitted from said reference laser device to produce a second combined light output;

(7) means for converting said second combined light output to an electric signal;

(8) a low pass filter through which a low frequency component of said electric signal is passed to produce beat pulses relative to said oscillation frequencies of said plurality of transmitting laser devices;

(9) means for comparing occurrence times between said train of beat pulses and a second train of reference electric pulses from said optical divider unit to produce a transmitted error signal; and,

(10) means for controlling oscillation frequencies of said plurality of transmitting laser devices such that said transmitted error signal is approximately equal to a predetermined value;

(b) a reference error signal generating unit comprising:

(1) means for combining said first divided light output and any remaining light outputs to produce a first combined light output;

(2) a first optical resonator having plural resonant frequencies to produce a first reference light output at said plural resonant frequencies, an interval between said plural resonant frequencies of said first optical resonator being equal to a predetermined oscillation frequency separation among said reference laser devices;

(3) means for converting said first reference light output into a first train of reference electric pulses;

(4) a plurality of means for detecting said first trains of said reference electric pulses with said sweeping signals, respectively, to produce synchronized electric signals;

(5) a plurality of low pass filters, each passing a synchronized electric signal to obtain a low frequency component thereof and produce a reference error signal to be supplied to said reference laser devices in said oscillation frequency separation stabilizing units, the number of said low pass filters being equal to the number of reference laser devices; and (c) an optical divider unit comprising:

(1) a second optical resonator having plural resonant frequencies to produce second reference light outputs at said plural resonant frequencies of said second optical resonator, an interval between said plural resonant frequencies of said second optical resonator being equal to a predetermined oscillation frequency separation among the plurality of transmitting laser devices in said oscillation frequency stabilizing units;

(2) means for dividing said second reference light output into a plurality of second divided reference light outputs, the number of second divided reference light outputs being equal to the number of said reference laser devices;

(3) means for combining said second divided reference light outputs and said second divided light outputs emitted from said reference laser devices to produce third reference light outputs;

(4) means for converting said third reference light outputs into second trains of reference electric pulses to be supplied to said oscillation frequency separation stabilizing units.

11. An apparatus for stabilizing oscillation frequency separation among a plurality of laser devices as claimed in claim 10 wherein said means for generating external sweeping signals is a signal generator selected from the group consisting of a sawtooth wave generator, a triangle wave generator, and a sine wave curve generator.

12. An apparatus for stabilizing oscillation frequency separation among a plurality of laser devices as claimed in claim 10 wherein said transmitting laser device is a semiconductor laser device.

13. An apparatus for stabilizing oscillation frequency separation among a plurality of laser devices as claimed in claim 10 wherein said reference laser device is a DBR-LD.

14. An apparatus for stabilizing oscillation frequency separation among a plurality of laser devices as claimed in claim 10 wherein said transmitting laser device is a DFB-LD.

15. An apparatus for stabilizing oscillation frequency separation among a plurality of laser devices as claimed in claim 10 wherein said first and second optical resonators are Fabrey-Perot optical resonators.

16. An apparatus for stabilizing oscillation frequency separation among a plurality of laser devices as claimed in claim 10 wherein said detecting means are selected from the group consisting of a lock-in amplifier, a balancing type mixer operating in analogue, and an exclusive OR (EX-OR) circuit operating in digital.

* * * * *

UNITED STATES PATENT AND TRADEMARK OFFICE
CERTIFICATE OF CORRECTION

PATENT NO. : 5,134,624

DATED : July 28, 1992

INVENTOR(S) : Takashi ONO

It is certified that error appears in the above-identified patent and that said Letters Patent is hereby corrected as shown below:

Col. 4, line 22 after "relationships", insert --among--

Col. 5, line 29, delete "$122A_2$"

Col. 6, line 68, delete "O" and insert --Q--

Signed and Sealed this

Eleventh Day of January, 1994

Attest:

Bruce Lehman

BRUCE LEHMAN

*Attesting Officer* *Commissioner of Patents and Trademarks*